US009113245B2

(12) United States Patent
Gelhard

(10) Patent No.: US 9,113,245 B2
(45) Date of Patent: Aug. 18, 2015

(54) HEADSET AND EARPHONE

(75) Inventor: Oliver Gelhard, Hannover (DE)

(73) Assignee: Sennheiser electronic GmbH & Co. KG, Wedemark (DE)

( * ) Notice: Subject to any disclaimer, the term of this patent is extended or adjusted under 35 U.S.C. 154(b) by 120 days.

(21) Appl. No.: 13/249,454

(22) Filed: Sep. 30, 2011

(65) Prior Publication Data

US 2013/0082691 A1 Apr. 4, 2013

(51) Int. Cl.

| | |
|---|---|
| ***G01R 33/00*** | (2006.01) |
| ***G01R 31/00*** | (2006.01) |
| ***H04R 25/00*** | (2006.01) |
| ***H04B 15/00*** | (2006.01) |
| ***H04R 5/033*** | (2006.01) |
| ***H04R 1/10*** | (2006.01) |
| *G10K 11/178* | (2006.01) |

(52) U.S. Cl.

CPC .............. *H04R 5/033* (2013.01); *H04R 1/1083* (2013.01); *G10K 11/1788* (2013.01); *G10K 2210/1081* (2013.01); *H04R 25/356* (2013.01); *H04R 25/505* (2013.01); *H04R 2460/01* (2013.01)

(58) Field of Classification Search

CPC ............... H04R 25/505; H04R 25/356; G10K 2210/1081; G10K 11/1788

See application file for complete search history.

(56) References Cited

U.S. PATENT DOCUMENTS

| | | | | |
|---|---|---|---|---|
| 3,936,822 A * | 2/1976 | Hirschberg | 340/522 |
| 5,675,655 A * | 10/1997 | Hatae | 381/26 |
| 5,729,694 A * | 3/1998 | Holzrichter et al. | 705/17 |
| 6,587,568 B1 * | 7/2003 | Sigwanz | 381/317 |
| 7,634,098 B2 * | 12/2009 | Townsend et al. | 381/321 |
| 2003/0133579 A1 * | 7/2003 | Danielsen et al. | 381/96 |
| 2005/0213774 A1 | 9/2005 | Kleinschmidt et al. | |
| 2005/0259837 A1 * | 11/2005 | Kinoshita | 381/163 |
| 2007/0053542 A1 * | 3/2007 | Lee | 381/380 |
| 2008/0013747 A1 * | 1/2008 | Tran | 381/67 |
| 2009/0003616 A1 | 1/2009 | Kleinschmidt et al. | |
| 2009/0220114 A1 * | 9/2009 | Wilson | 381/317 |
| 2010/0061563 A1 * | 3/2010 | Gelhard et al. | 381/71.4 |

FOREIGN PATENT DOCUMENTS

| | | |
|---|---|---|
| EP | 1 587 342 | 10/2005 |

OTHER PUBLICATIONS

"Application Note 3660: PCB Layout Techniques to Achieve RF Immunity for Audio Amplifiers". Maxim Integrated. Jul. 4, 2006. http://www.maximintegrated.com/en/app-notes/index.mvp/id/3660.*

Becker, "Magnetic Field", 2009, San Jose State University, http://www.physics.sjsu.edu/becker/physics51/mag_field.htm.*

Extended European Search Report dated Jan. 27, 2014 for EP application No. 12186786.5.

* cited by examiner

*Primary Examiner* — Jermele M Hollington
*Assistant Examiner* — Hoang X Nguyen
(74) *Attorney, Agent, or Firm* — Frommer Lawrence & Haug LLP

(57) ABSTRACT

A headset or earphone is provided, having an electro-acoustic reproduction transducer with an oscillator coil arranged in an axis. An amplifier is coupled to the electro-acoustic reproduction transducer. The headset or earphone also has a magnetic interference sensor for measuring a magnetic interference field. A correction unit, for analyzing an output of the magnetic interference sensor and for producing a compensation signal, is coupled to the magnetic interference sensor. In addition, the headset or earphone also includes an adding unit for adding the compensation signal to an input signal and for outputting the result to the amplifier.

9 Claims, 1 Drawing Sheet

HEADSET AND EARPHONE

BACKGROUND OF THE INVENTION

1. Field of the Invention

The present invention relates to a headset as well as an earphone.

2. Description of Related Art

Known headsets as well as known earphones or headphones are subject to noise in particular in airplanes which can result from the magnetic fields produced by the onboard power supply. Therefore, the headsets and earphones or headphones are prone to low frequent inductive radiation.

SUMMARY OF THE INVENTION

It is therefore an object of the invention to provide a headset as well as an earphone which are less prone to inductively produced radiation.

Therefore, a headset or earphone is provided which comprises an electro-acoustic reproduction transducer having an oscillator coil, an amplifier coupled to the electro-acoustic transducer, a magnetic interference sensor for measuring a magnetic interference field, a correction unit coupled to the magnetic interference sensor for analyzing an output of the magnetic interference sensor and for producing a compensation signal. The headset or earphone furthermore comprises an adding unit for adding the compensation signal to an input signal and for outputting the result thereof to the amplifier.

According to an aspect of the invention, the magnetic interference sensor is arranged adjacent or in close proximity to the electro-acoustic reproduction transducer. This is advantageous as in this case, the magnetic interference sensor will exactly detect the magnetic interference that is detected by the electro-acoustic reproduction transducer.

According to an aspect of the invention, the magnetic interference field sensor is arranged in the same axis as the oscillator coil of the electro-acoustic reproduction transducer. This is also advantageous as the magnetic interference field sensor will detect approximately the same magnetic interference as the electro-acoustic reproduction transducer.

The invention also relates to a headset or earphone comprising an active noise reduction unit, an electro-acoustic reproduction transducer having an oscillator coil, an amplifier coupled to the electro-acoustic reproduction transducer, a magnetic interference sensor for measuring a magnetic interference field, a correction unit coupled to the magnetic interference sensor for analyzing an output of the magnetic interference sensor and for producing a compensation signal and an adding unit for adding the compensation signal, an output of the active noise reduction unit to an input signal and for outputting a result to the amplifier.

The present invention relates to the idea that instead of shielding a headset or an earphone from inductive noise radiation or magnetic interference fields, a sensor is provided for sensing the inductive noise signal produced by the inductive radiation or the magnetic interference fields. The output of the sensor is processed and added to the audio input signal for the earphone or headset. The output signal of the signal processing unit is added to the input signal such that a noise signal with a reduced noise level is achieved.

According to the invention the above described inductive noise compensation can also be used for other electro-acoustic devices where a magnetic interference field or noise field can act upon the moving or oscillator coil.

Preferably, the sensor is arranged close to the electro-acoustic transducer and in particular to the oscillator coil.

DETAILED DESCRIPTION OF EMBODIMENTS

It is to be understood that the figures and descriptions of the present invention have been simplified to illustrate elements that are relevant for a clear understanding of the present invention, while eliminating, for purposes of clarity, many other elements which are conventional in this art. Those of ordinary skill in the art will recognize that other elements are desirable for implementing the present invention. However, because such elements are well known in the art, and because they do not facilitate a better understanding of the present invention, a discussion of such elements is not provided herein.

The present invention will now be described in detail on the basis of exemplary embodiments.

Figure 1:
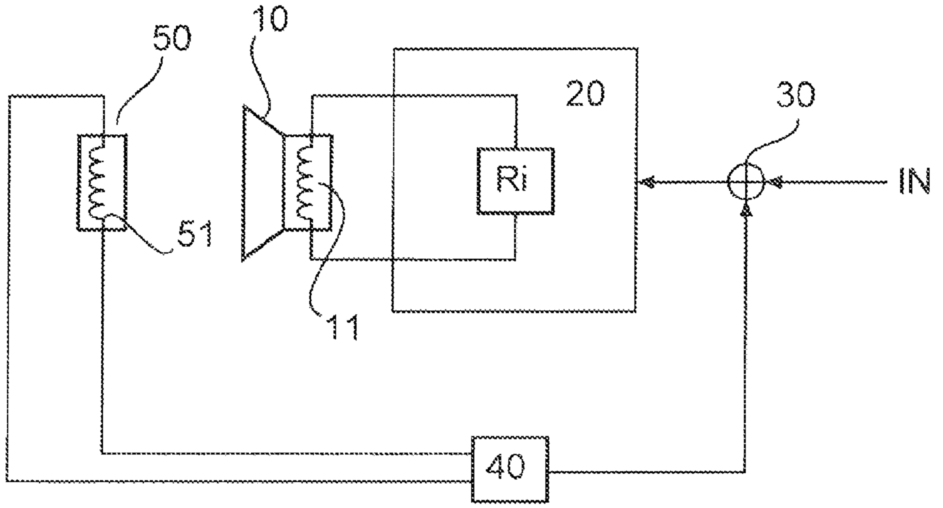
FIG. 1 shows a schematic block diagram of an earphone or headset according to a first embodiment.

FIG. 1 shows a schematic block diagram of an earphone or headset according to a first embodiment of the invention. The headset or earphone comprises an electro-acoustic reproduction transducer 10 connected to an amplifier 20 and a magnetic interference sensor 50 coupled to a correction unit 40. The headset or earphone also comprises an adding unit 30 for adding the compensation signal from the correction unit 40 to an input signal IN of the headset or earphone. The electro-acoustic transducer 10 comprises an oscillator coil 11. The amplifier unit 20 comprises an internal resistor Ri. The magnetic interference sensor 50 comprises a coil 51 for detecting a magnetic interference field. The output of the magnetic interference sensor 50 is coupled to the correction unit 40, which generates a compensation signal based on the output signal of the sensor 50. The compensation signal is added to the input signal IN by means of the adding unit 30.

The present invention relates to the realization that the oscillator coil in the electro-acoustic transducer together with the electrical output resistance Ri of the amplifier 50 form a closed conductor loop. Any magnetic field in the vicinity of the closed conductor loop will induce an electrical current into it. This current can act upon the oscillator coil and can produce a movement of the oscillator coil which will correspond to an unwanted noise signal.

With the magnetic interference field sensor according to the invention it is possible to detect the presence of a magnetic interference field. The output of the sensor serves as input to the correction unit 40, which will produce a compensation signal for compensating the effect of the noise signal introduced by the magnetic interference noise. Preferably the compensation signal is produced such that after adding that to the noise signal (i. e. the input signal), the resulting signal will be zero such that the noise signal due to the magnetic interference is significantly reduced.

The sensor according to the invention should be arranged such that it can detect the magnetic interference field as it is experienced by the electrical acoustic reproduction transducer (the oscillator coil). Therefore, the sensor should be arranged in close proximity or adjacent to the oscillator coil. Preferably the magnetic interference should be arranged at the same axis as the oscillator coil.

Figure 2:
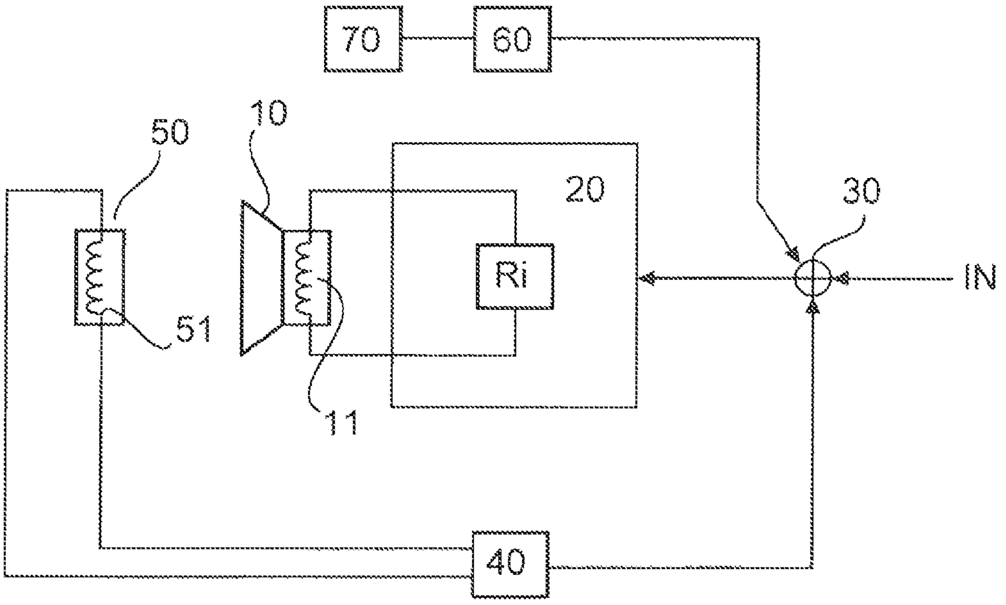
FIG. 2 shows a schematic block diagram of an earphone or headset according to a second embodiment.

FIG. 2 shows a schematic block diagram of an earphone or headset according to a second embodiment. The earphone or headset according to the second embodiment substantially corresponds to the earphone or headset according to a first embodiment. Therefore, it comprises an adding unit 30, an amplifier 20, an electro-acoustic reproduction transducer 10, a magnetic interference sensor 50, and a correction unit 40. In addition, the earphone or headset comprises a microphone 70 for detecting noise signals and an active noise reduction unit 60 for performing an active noise reduction or an active noise cancelling based on the output signal of the microphone. The active noise reduction unit 60 generates a noise compensation signal which is forwarded to the adding unit 30 such that it is combined with the compensation signal from the correction unit 40 and the input signal IN. The output of the adding unit is forwarded to the amplifier 20 and reproduced by the electro-acoustic transducer 10.

The basic idea of the invention is in particular advantageous for earphones or headsets with an ANR (active noise reduction) as this active noise reduction can be so good that the noise introduced by the magnetic interference can be audible. If the active noise reduction is not of such a good quality, the noise introduced by the magnetic interference field may not be audible. The same applies to earphones with an active noise reduction capability.

According to a third embodiment, the sensor 50 can be arranged on the housing of the electrical transducer or alternatively it can be arranged on a circuit board fixedly connected to the housing of the transducer. Alternatively, the sensor 50 can be arranged on the side of the transducer which is towards the ear of the user. As mentioned above, the arrangement of the sensor 50 should be such that it is acted upon by the same magnetic field as the oscillator coil.

What is claimed is:

1. A headset or earphone, comprising an electro-acoustic reproduction transducer having an oscillator coil arranged in an axis;

an amplifier coupled to the electro-acoustic reproduction transducer;

a magnetic interference sensor configured to measure a magnetic interference field that (1) is experienced by the electro-acoustic reproduction transducer and that (2) generates an acoustic noise signal by inducing an electrical current into the oscillator coil;

a correction unit, coupled to the magnetic interference sensor, configured to analyze an output of the magnetic interference sensor and to produce a compensation signal; and an adding unit configured to add the compensation signal to an input signal and for outputting the result to the amplifier to cancel the acoustic noise signal generated in the oscillator coil of the transducer by the magnetic interference field.

2. The headset or earphone according to claim 1;

wherein the magnetic interference sensor is arranged adjacent or in close proximity to the electro-acoustic reproduction transducer.

3. The headset or earphone according to claim 2;

wherein the magnetic interference field sensor is arranged in a same axis as the oscillator coil of the electro-acoustic reproduction transducer.

4. A headset or earphone, comprising:

an active noise reduction unit adapted to actively compensate any noise detected by a microphone;

an electro-acoustic reproduction transducer having an oscillator coil;

an amplifier coupled to the electro-acoustic reproduction transducer;

a magnetic interference sensor configured to measure a magnetic interference field that (1) is experienced by the electro-acoustic reproduction transducer and that (2) generates an acoustic noise signal by inducing an electrical current into the oscillator coil;

a correction unit, coupled to the magnetic interference sensor, configured to analyze an output of the magnetic interference sensor and to produce a compensation signal; and an adding unit configured to add the compensation signal and an output signal of the active noise reduction to an input signal and to output the result to the amplifier to cancel the acoustic noise signal generated in the oscillator coil of the transducer by the magnetic interference field.

5. The headset or earphone according to claim 1;

wherein the magnetic interference field sensor is arranged in a same axis as the oscillator coil of the electro-acoustic reproduction transducer.

6. A headset or earphone, comprising:

an electro-acoustic reproduction transducer having an oscillator coil;

an amplifier comprising an electrical output resistance, the amplifier being coupled to the electro-acoustic reproduction transducer so that the oscillator coil and the electrical output resistance form a closed electrical-circuit loop;

a magnetic interference sensor arranged such that it detects a magnetic interference field that (1) is experienced by the electro-acoustic reproduction transducer and that (2) generates an acoustic noise signal by inducing an electrical current into the closed electrical-circuit loop;

a correction unit, coupled to the magnetic interference sensor, configured to analyze an output of the magnetic interference sensor and to produce a compensation signal; and an adding unit configured to add the compensation signal to an input signal and to output the result to the amplifier to cancel the acoustic noise signal generated in the closed electrical-circuit loop of the oscillator coil and the electrical output resistance by the magnetic interference field.

7. The headset or earphone according to claim 1;

wherein the compensation signal is produced by the correction unit such that a sum of the compensation signal and the acoustic noise signal is zero.

8. The headset or earphone according to claim 4;

wherein the compensation signal is produced by the correction unit such that a sum of the compensation signal and the acoustic noise signal is zero.

9. The headset or earphone according to claim 6;

wherein the compensation signal is produced by the correction unit such that a sum of the compensation signal and the acoustic noise signal is zero.

* * * * *